United States Patent
Sato et al.

(10) Patent No.: US 10,324,552 B2
(45) Date of Patent: Jun. 18, 2019

(54) TOUCH PANEL HAVING A CURVED SURFACE INPUT REGION AND A PLURALITY OF ELECTRODES FORMED OF DUCTILE WIRE MATERIALS

(71) Applicant: Wonder Future Corporation, Yokohama-shi, Kanagawa (JP)

(72) Inventors: Akira Sato, Yokohama (JP); Koki Fukuda, Yokohama (JP); Kazuhiro Sugiyama, Yokohama (JP)

(73) Assignee: WONDER FUTURE CORPORATION, Yokohama (JP)

( * ) Notice: Subject to any disclaimer, the term of this patent is extended or adjusted under 35 U.S.C. 154(b) by 0 days.

(21) Appl. No.: 15/318,957

(22) PCT Filed: Nov. 10, 2014

(86) PCT No.: PCT/JP2014/079707
§ 371 (c)(1),
(2) Date: Dec. 14, 2016

(87) PCT Pub. No.: WO2016/075737
PCT Pub. Date: May 19, 2016

(65) Prior Publication Data
US 2017/0249037 A1    Aug. 31, 2017

(51) Int. Cl.
*G06F 3/041* (2006.01)
*G06F 3/01* (2006.01)
(Continued)

(52) U.S. Cl.
CPC ............ *G06F 3/0412* (2013.01); *G06F 3/016* (2013.01); *G06F 3/041* (2013.01); *G06F 3/044* (2013.01);
(Continued)

(58) Field of Classification Search
CPC ......... G09G 3/044; G06F 3/044; G06F 3/041; G06F 3/0412; G06F 3/016; B60K 35/00; H01L 27/323
(Continued)

(56) References Cited

U.S. PATENT DOCUMENTS

2008/0314725 A1    12/2008   Karhiniemi et al.
2011/0248954 A1*   10/2011   Hamada ................ G06F 3/044
                                                      345/174
(Continued)

FOREIGN PATENT DOCUMENTS

CN         203311402 U    11/2013
EP         2579146 A2      4/2013
(Continued)

OTHER PUBLICATIONS

ISA/JP, International Search Report dated Feb. 10, 2015 in International Application No. PCT/JP2014/079707, total 2 pages with translation.
(Continued)

*Primary Examiner* — Adam J Snyder
(74) *Attorney, Agent, or Firm* — Masuvalley & Partners

(57) ABSTRACT

Provided is a touch panel having a curved surface. A touch panel 10 is formed of a sheet of a flat sheet 1 by thermoforming. A plurality of island-like electrodes 2,3 is arrayed in each of an X direction and a Y direction on the input region. The island-like electrodes 2, 3, inter-electrode wires 4, and a lead wiring are formed of a ductile wire material. A center portion of the flat sheet 1 is formed into a convex dome shape by thermoforming. The touch panel 10 includes a first input region 11 and a second input region 12. The first input region 11 is provided on the convex dome shape. The second input region 12 is provided on the flat surface (zero
(Continued)

curvature). The first input region 11 is provided at around a center on the inside of the second input region 12.

12 Claims, 10 Drawing Sheets

(51) Int. Cl.
 *G06F 3/044* (2006.01)
 *B60K 35/00* (2006.01)
 *H01L 27/32* (2006.01)
(52) U.S. Cl.
 CPC ...... *B60K 35/00* (2013.01); *B60K 2350/1028* (2013.01); *B60K 2350/928* (2013.01); *G06F 2203/04103* (2013.01); *G06F 2203/04104* (2013.01); *G06F 2203/04112* (2013.01); *H01L 27/323* (2013.01)
(58) Field of Classification Search
 USPC .................... 345/174, 173; 178/18.06, 18.01
 See application file for complete search history.

(56) References Cited

U.S. PATENT DOCUMENTS

| | | | | |
|---|---|---|---|---|
| 2012/0032916 | A1* | 2/2012 | Enoki | G06F 3/044 345/174 |
| 2013/0335375 | A1* | 12/2013 | Nishikawa | G06F 3/044 345/174 |
| 2013/0342331 | A1* | 12/2013 | Fukushima | G06F 3/044 340/407.2 |
| 2014/0098307 | A1* | 4/2014 | Iwami | G06F 3/044 349/12 |
| 2014/0168109 | A1* | 6/2014 | Kang | G06F 3/044 345/173 |
| 2014/0225855 | A1* | 8/2014 | Aitchison | G06F 3/041 345/173 |

FOREIGN PATENT DOCUMENTS

| | | |
|---|---|---|
| JP | 2003-091360 A | 3/2003 |
| JP | 2007-279819 A | 10/2007 |
| JP | 2010-244772 A | 10/2010 |
| JP | 2010-267607 A | 11/2010 |
| JP | 2013-091854 A | 5/2013 |
| JP | 2013-246741 A | 12/2013 |
| JP | 2014-002580 A | 1/2014 |
| JP | 2014-006565 A | 1/2014 |
| JP | 2014-026384 A | 2/2014 |
| TW | 201037587 A | 10/2010 |
| WO | 2007/099733 A1 | 9/2007 |
| WO | 2014/041967 A1 | 3/2014 |

OTHER PUBLICATIONS

IPEA/JP, International Preliminary Report on Patentability dated Oct. 22, 2015 in International Application No. PCT/JP2014/079707, Total 10 pages with translation.

EPO, Extended European Search Report dated Dec. 18, 2017 in corresponding EP Patent Application No. 14906072.5, total 6 pages.

CNIPA, Chinese Office Action dated Oct. 26, 2018 in corresponding Chinese Application Number.

\* cited by examiner

TOUCH PANEL HAVING A CURVED SURFACE INPUT REGION AND A PLURALITY OF ELECTRODES FORMED OF DUCTILE WIRE MATERIALS

RELATED APPLICATIONS

This application is the U.S. National Phase application under 35 U.S.C. § 371 of International Patent Application No. PCT/JP2014/079707, filed on Nov. 10, 2014, which is hereby expressly incorporated by reference in its entirety for all purposes.

TECHNICAL FIELD

The present invention relates to a touch panel and technology of touch panel. More specifically, the present invention relates to a touch panel including an input region that is provided on a curved surface shape.

BACKGROUND ART

A touch panel is used as an input device. The input device is a device for operating various kinds of electronic devices. The touch panel is mounted on, for example, a side of a display surface of a liquid crystal display device. An input operation is performed in accordance with display contents displayed by the display device, the display contents being viewed through the touch panel. For example, an arbitrary point on a touch surface is designated (touched or approached) by an input tool (e.g., touch pen, etc.) or a finger of a person. This enables inputting. For example, an electrostatic capacity coupling type touch panel and a resistance film type touch panel are known as examples of such touch panel.

The electrostatic capacity coupling type touch panel is provided with detection electrodes for detecting a touch position. The detection electrodes are arranged along a two-dimensional (x, y) direction of a video image displaying region (an input region input by means of touch or approach). Each of the detection electrodes is made of, for example, crystallized (or amorphous) ITO (Indium Tin Oxide), IZO (Indium Zinc Oxide), etc. Alternatively, the detection electrode is made of a conductive thin wire (see, for example, Patent Literature 1). The electrodes are provided on two surfaces (or one surface) of a base material made of a transparent glass (or a transparent resin film). A video image non-displaying region (a region on the outside of the video image display region (frame region)) is provided with a drawer type circuit pattern formed thereon. The drawer type circuit pattern is connected to the detection electrodes. The drawer type circuit pattern is formed on a surface to be provided with the detection electrodes.

CITATION LIST

Patent Literature

PATENT LITERATURE 1: JP2013-091854

SUMMARY OF INVENTION

Technical Problem

When referring to characteristics of a transparent conductive film made of ITO (IZO), etc., high light transmittance is contradictory to low resistance. It is difficult to keep both of high light transmittance and low resistance at the same time. The transparent conductive film made of ITO (IZO), etc. is hard, susceptible to deformation, and tends to generate cracks. The transparent conductive film lacks flexibility. In other words, if the ITO (IZO)-made transparent conductive film is used even with a transparent resin film as a base material thereof, the transparent conductive film still lacks flexibility.

As a result, an input region of a touch panel used to have a flat surface, which limited an applicable range of the touch panel. Presently, a touch panel is used in mobile devices such as smartphones and tablet terminals. In any of the mobile devices, however, the input region has a flat surface.

The present invention is made to solve the above described problem. A purpose of the present invention is to provide a touch panel having a curved surface shape.

Solution to Problem

The present invention for solving the above described problem is directed to a touch panel equipped with a curved shape body, an input region provided on the curved (surface) shape body, and a plurality of electrodes arranged within the input region, wherein the electrodes are formed of a ductile wire material.

In the above described invention, preferably, the ductile wire material is composed of at least one selected from a metal of at least one of Au, Ag, Cu, Al, an electroconductive carbon, and an electroconductive organic compound.

In a case where the electrodes, etc. are made of a ductile wire material, a flat sheet can be formed into any curved surface shape by thermoforming without fear of disconnection.

In the above described invention, preferably, the input region has a plurality of curvatures.

With respect to the plurality of curvatures, there are cases where there is a plurality of curved surfaces each having a different curvature and where there is a single curved surface having different curvatures in a different axis direction of the single curved surface.

In the above described invention, preferably, the input region includes a first input region and a second input region having a curvature different from that of the first input region, wherein the first input region is continuous to the second input region.

When a boundary portion is formed between the input regions, one input region can be easily discriminated from the other input region by tactile impression.

In the above described invention, further preferably, the curvature of the second input region is zero.

In other words, the curved shape body is composed of a curved surface and a flat surface. This eases recognition of the input regions by tactile impression. It is so defined that the curved shape body includes all the shapes partially having a curved surface but excludes a body entirely shaped only of a flat surface.

In the above described invention, further preferably, the first input region is provided on a dome shaped portion on the inside of the second input region.

In the above described invention, further preferably, the first input region is provided on the outside of the second input region.

In the above described invention, preferably, a plurality of electrodes is arranged within the input region in its X direction and Y direction, wherein the curvature of the input region in the X direction differs from the curvature of the input region in the Y direction.

When a top portion is formed, one input region can be easily discriminated from the other input region by tactile impression.

The present invention for solving the above described problem is directed to an input/output integrated type display device characterized in being equipped with the touch panel and an organic EL display device.

The present invention for solving the above described problem is directed to an input/output integrated type display device characterized in being equipped with the touch panel and a projector.

The organic EL display device and the projector can be applied to a touch panel having a curved surface shape because they can display an image onto a curved surface.

In a method of manufacturing the touch panel of the present invention for solving the above described problem, the electrodes are arranged on the inside of a flat sheet, and the flat sheet is formed into a curved shape body by thermoforming.

Advantageous Effect of Invention

The present invention can provide a touch panel having a curved surface shape.

DESCRIPTION OF EMBODIMENTS

First Embodiment

~Structure~

Figure 1:
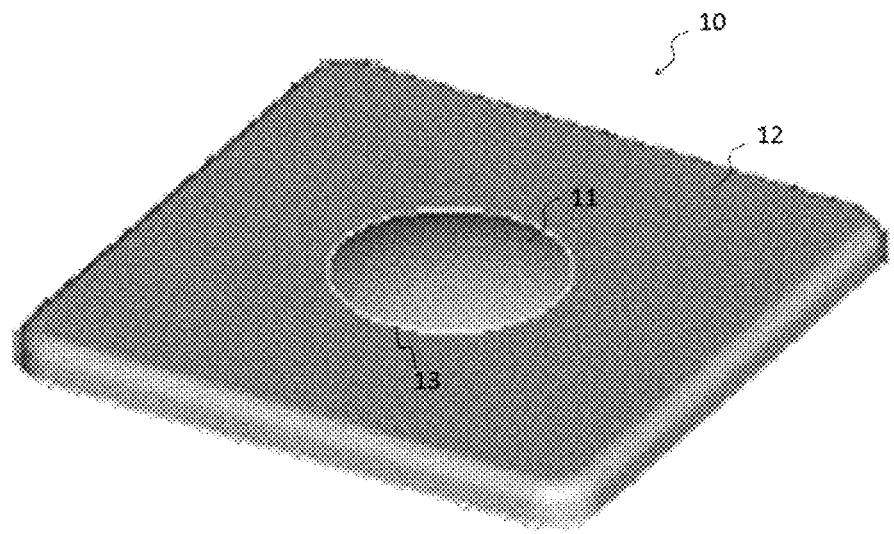
FIG. 1 is a perspective view of a curved shape body on which a touch panel is provided (first embodiment).

A touch panel according to a first embodiment of the present invention will be described below. FIG. 1 is a perspective view illustrating the first embodiment.

A touch panel 10 is provided on a curved shape body. The curved shape body is composed of a flat surface and a dome shape. The touch panel 10 includes a first input region 11 and a second input region 12.

The first input region 11 has a convex dome shape. The second input region 12 has a flat surface shape (zero curvature). The first input region 11 is provided at around a center on the inside of the second input region 12.

A radius of curvature of the first input region 11 is, for example, R40 (radius of curvature of 40 mm), and a curvature of the second input region 12 is zero (infinite radius of curvature). In other words, the touch panel 10 includes two regions having different curvatures. The first input region 11 is physically continuous to the second input region 12, and a boundary portion 13 is formed at a boundary between the two regions.

Incidentally, two regions are not mathematically continuous in FIG. 1 but may be mathematically continuous (differentiable).

In the present embodiment, the convex dome shape is referred to but a concave dome shape is also acceptable.

~Manufacturing Method~

Figure 2:
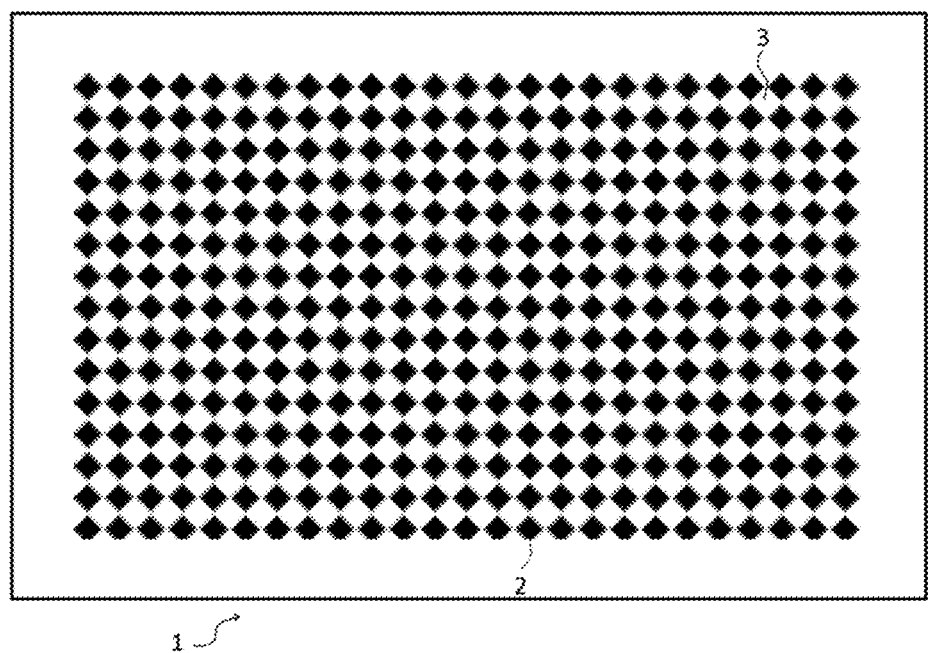
FIG. 2 is a plan view illustrating a flat sheet.

The touch panel 10 is formed of a sheet of flat sheet 1 by thermoforming. FIG. 2 is a plan view illustrating the flat sheet.

The flat sheet 1 is provided with a plurality of electrodes (e.g., island-like electrodes) arranged thereon. For example, the electrodes are provided on both surfaces (a front surface and a rear surface) of the film. The front surface is provided with an electrode array of a plurality of island-like electrodes 2 in an x direction (or a y direction). The rear surface is provided with an electrode array of a plurality of island-like electrodes 3 in the y direction (or the x direction).

In FIG. 2, it is provided that a horizontal direction is the x direction, and a vertical direction is the y direction. In FIG. 2, black portions are the island-like electrodes 2, and white portions are the island-like electrodes 3.

Figure 3:
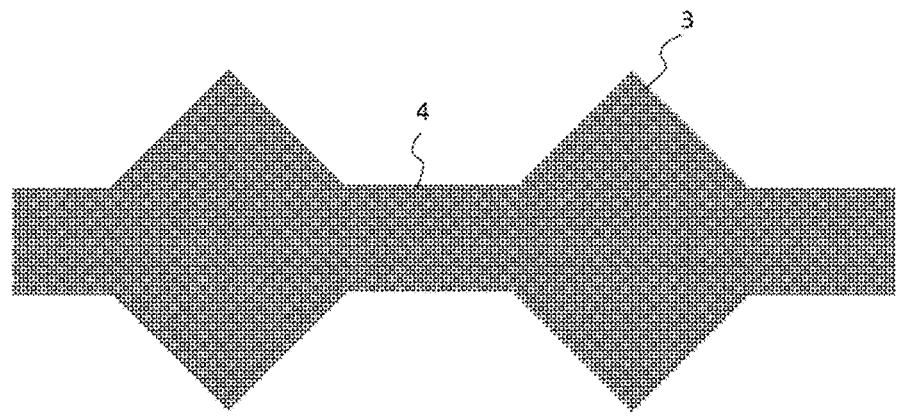
FIG. 3 illustrates an island-like electrode in detail.

FIG. 3 illustrates island-like electrodes in detail. The electrode array of the island-like electrodes 2 is electrically connected via an inter-electrode wire 4. The electrode array of the island-like electrodes 3 is electrically connected via the inter-electrode wire 4. Ends of the electrode arrays of the island-like electrodes 2, 3 are connected to lead wirings (not shown).

Further, the flat sheet 1 is provided with a touch panel terminal portion and through holes (not shown).

Each island-like electrode has an outer dimension of, for example, 2 mm to 5 mm. An outer width of the inter-electrode wire is smaller than the outer dimension of the island-like electrode.

A distance (distance between sides defining the outer dimension of the island-like electrode) between the neighboring island-like electrodes (island-like electrodes which are connected via the inter-electrode wire) is, for example, 20 μm to 100 μm.

A lead wiring is a wiring for transferring signals from the electrode arrays of the island-like electrodes 2, 3 to an external circuit. The lead wiring is made of a conductive material having high conductivity. The lead wiring may be a mesh-patterned wire or a non-mesh-patterned wire (solid).

The island-like electrodes 2, 3, and the inter-electrode wires 4 are preferably made of a mesh-patterned conductor for the purpose of enhancing light transmittance, especially, in a case of being combined with a display device (will be described below). A mesh pattern having an aperture ratio equal to or more than 90% is preferred. With the structure, a thin wire is hardly viewed, and thus a field of a display screen can be made brighter.

Further, the island-like electrodes 2, 3, the inter-electrode wire 4, and the lead wiring are made of a ductile wire material. The ductile wire material is composed of a metal such as Au, Ag, Cu, Al, etc., an alloy made of two or more the aforementioned metals, an electroconductive carbon, an electroconductive organic compound, etc.

A mesh-patterned conductor is formed by, for example, a method of printing by using a conductive ink, a method of etching a conductor thin film, a metal vapor deposition method using a vapor deposition mask, a conductive silver forming method using silver salt, etc.

Because of the characteristics of the mesh-patterned conductor and the ductile wire material, disconnection hardly occurs even when the flat surface is formed into a curved surface.

Accordingly, the island-like electrodes are arranged to be formed into a lattice shape (two-dimensional shape). The island-like electrodes formed on a front surface of a film and the island-like electrodes formed on a rear surface of the film are arranged in such a manner that they do not substantially overlap each other. The island-like electrodes arranged in the above described manner can detect a capacity change at a (x, y) position. Further, serial detection thereof enables multi-touch detection.

A method for detecting a capacity change includes a self-capacitance type detection method and a mutual capacitance type detection method.

In the self-capacitance type detection method, an electrode array of the island-like electrodes arranged in the x direction are supplied with voltage signals for detecting a touch position in sequence. The electrode array of the island-like electrodes arranged in they direction are supplied with voltage signals for detecting a touch position in sequence. A capacity between an island-like electrode array A, opposing to the touch position, arranged in the x direction and an island-like electrode array B arranged in the y direction and a GND (ground) increases. As a result, wave forms of transmission signals from the island-like electrode array A and the island-like electrode array B come to be different from wave forms of transmission signals from an island-like electrode array A' arranged in the x direction and an island-like electrode array B' arranged in the y direction, which is another combination of the island-like electrode array A arranged in the x direction and the island-like electrode array B arranged in the y direction. A touch panel control/signal processing circuit (not shown) performs operation of the touch position on the basis of the transmission signals supplied from the island-like electrode arrays.

In the mutual capacitance type detection method, for example, an island-like electrode array arranged in the x direction is supplied with voltage signals for detecting a touch position in sequence, and an island-like electrode array arranged in the y direction is subjected to sensing (detection of transmission signals) in sequence. A stray capacitance of an indicator is added, in parallel, to a parasitic capacitance between the island-like electrode array A, opposing to the touch position, arranged in the x direction and the island-like electrode array B arranged in the y direction. A wave form of the transmission signal from the island-like electrode array B arranged in the y direction is different from a wave form of the transmission signal from the island-like electrode array B' arranged in they direction other than the wave form of the transmission signal from the island-like electrode array B arranged in the y direction. The touch panel control/signal processing circuit performs operation of the touch position on the basis of an order of the island-like electrode array arranged in the x direction for supplying voltage signals and the transmission signals from the island-like electrode array arranged in the y direction for receiving the voltage signals.

The flat sheet 1 is made of resin. In the first embodiment, the flat sheet 1 is not necessarily transparent but, in a case of combination with a display device, is preferably transparent.

Such flat sheet 1 is formed into a curved shape body by thermoforming. More specifically, a range corresponding to the first input region 11 is formed into a dome shape.

Further, a hard coat layer is provided on an outermost layer. The hard coat layer preferably has a thickness of 1 μm to 20 μm. Still further, unnecessary parts thereof may be trimmed.

~Exemplary Application and Effect~

Figure 4:
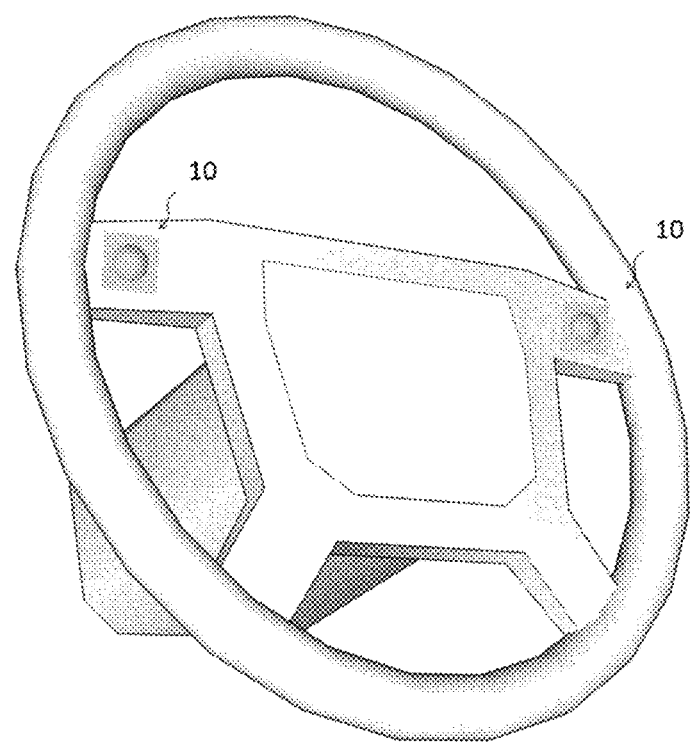
FIG. 4 illustrates an exemplary application to a steering (first embodiment).

FIG. 4 illustrates an exemplary application of the first embodiment. For example, the structure of the first embodiment is applied to a steering of a vehicle.

Presently, operations such as adjustment of a vehicle interior temperature, selection of audio information, volume adjustment, etc. can be performed even while driving. The operation panel thereof is installed on a center console. Therefore, a driver instantly turns his eyes upon the center console from the running direction when operating the operation panel. Even an instant averting of the driver's eyes is not preferred while driving. Also, even an instant releasing of the driver's hands from the steering is not preferred.

As one of the characteristics of the touch panel, various functions can be added at arbitrary points of the touch panel. In the present exemplary application, instead of an operation panel, the touch panel is applied to a steering of a vehicle.

As an example, each of four sides such as up, down, left, or right around the dome (see, illustration) in the second input region 12 (flat surface portion) is assigned with a selection function. For example, adjustment of a vehicle interior temperature, selection of audio information, volume adjustment, etc. can be selected.

In the first input region 11, a value adjustment function is assigned to a dome periphery (adjacent to the boundary portion 13). For example, in a case of volume adjustment, an instruction is input in such a manner that turning over in a clockwise direction enables increasing of volume, and turning over in a counterclockwise direction enables decreasing of volume. In the first input region 11, a setting key is assigned to a top portion of the dome.

For example, in a case where a driver desires to increase volume while driving, the driver makes double tapping of the flat surface portion of an upper side near the dome, thereby selecting the volume adjustment. Then, the driver rotationally slides his finger (dials) in a clockwise direction along the dome periphery, and makes one tapping on the top portion of the dome to end the volume adjustment.

At the time, the driver can roughly recognize where he is touching in the touch panel because he can feel the center of the dome.

Incidentally, in a case of the input region composed only of a flat surface, the driver needs to visually confirm the input position.

To the contrary, because the touch panel 10 includes the boundary portion 13, the first input region 11 can be easily discriminated from the second input region by tactile impression. Not only easy recognition of the dome shape by tactile impression but also easy recognition of positions on the flat surface shape by tactile impression can be achieved owing to a relative positional relationship with the dome. This can prevent misoperation.

Furthermore, in the touch panel 10, a plurality of operation functions can be consolidated. This allows downsizing of the touch panel, and thus the touch panel 10 can be positioned in a movable range of a thumb at each of left and right ends of a steering.

Because of the positioning and discrimination by tactile impression, the driver can operate the touch panel 10 without averting his eyes and without releasing his hands from the steering while driving. This can prevent also misoperation.

Further, because the touch panel 10 includes no moving element such as a mechanical operation panel, a risk of breakage decreases.

In the present exemplary application, the display device is not essential. Confirmation of tapping and a set temperature or volume may be announced by voice. Alternatively, by installing a light source inside the touch panel 10, confirmation of tapping and a set temperature or volume may be informed by ON/OFF of the light source, light intensity, or color change of light. Further alternatively, a display device may be provided at a center of a steering.

Of course, the touch panel 10 may be combined with a display device to be made into an input/output integrated type device. The display device may be a liquid crystal display device (LCD). The touch panel 10 is formed of transparent resin. An operation selection button is displayed at a position corresponding to the second input region 12, an adjustment value is displayed at a position corresponding to the boundary portion 13, and a set temperature, a number of a selected song, a set volume, etc. are displayed at a position corresponding to the first input region 11.

Incidentally, a display at a position corresponding to the first input region 11 is recognized via a space formed within the dome. Even with such a structure, there is no problem in visibility in so far as it is a simple number display.

Instead of a general liquid crystal display device, an organic EL display device may be employed. The organic EL display device has a feature capable of being formed into a curved surface and thus is applicable to a display device of the touch panel 10.

As described above, as one of the characteristics of the touch panel, input of various functions can be added to arbitrary points. By displaying a selection menu on a display device and selecting a desired operation from the selection menu, more complex operation can be input with ease.

Second Embodiment

~Structure~

Figure 5:
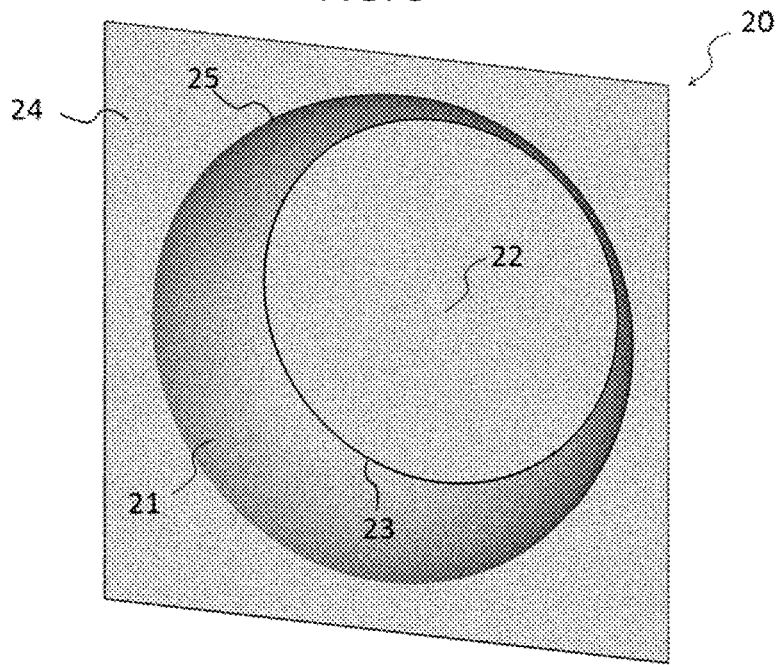
FIG. 5 is a perspective view illustrating a curved shape body on which a touch panel is provided (second embodiment).

A touch panel according to a second embodiment of the present invention will be described below. FIG. 5 is a perspective view illustrating a second embodiment.

A touch panel 20 is provided on a curved shape body. The curved shape body is composed of a mountainside shape and a flat surface of a tableland formed on a mountain top. The touch panel 20 includes a first input region 21 and a second input region 22.

The first input region 21 is provided on the mountainside of a convex dome. The second input region 22 is provided on the surface of the tableland formed on the mountain top, the surface being a flat surface shape (having a zero curvature). The second input region 22 is provided at around a center on the inside of the first input region 21. In other words, the first input region 21 is provided outside the second input region 22.

A radius of curvature of the first input region 21 is, for example, R40 (radius of curvature of 40 mm). A curvature of the second input region 22 is zero (infinite radius of curvature). In other words, the touch panel 20 includes two different curvatures. The first input region 21 is continuous to the second input region 22, and a boundary portion 23 is formed at a boundary between the regions.

The other structure of the second embodiment is identical to the structure of the first embodiment. A manufacturing method of the second embodiment is also identical to the manufacturing method of the first embodiment.

~Exemplary Application and Effect~

The second embodiment is a modification of the first embodiment, and thus about the equivalent effect can be expected.

The structure of the second embodiment can be used for an operation panel of a vehicle alike the first embodiment.

Further, because the second input region 22 is positioned at a center, a general liquid crystal display device can be applied to a position corresponding to the second input region 22. For example, at a position corresponding to the second input region 22, operation selection buttons are displayed on four sides, and a set temperature, a number of a selected song, a set volume, etc. are displayed at the center. At a position corresponding to the boundary portion 23, an adjustment value is displayed. On the other hand, a value adjustment function is assigned to a position near the boundary portion of the first input region 21. This makes a rotationally sliding operation easy.

Modification Example

A third input region 24 may be provided on a flat surface on the outside of the first input region 21. A boundary portion 25 is formed at a boundary between the regions, thereby expanding input region. This eases input of more complex operation. Because of the boundary portion 25, the first input region 21 can be easily discriminated from the third input region 24 by tactile impression. This can prevent misoperation.

In the present embodiment, a mountain shape is referred to but a valley shape is also acceptable.

Third Embodiment

~Structure~

Figure 6:
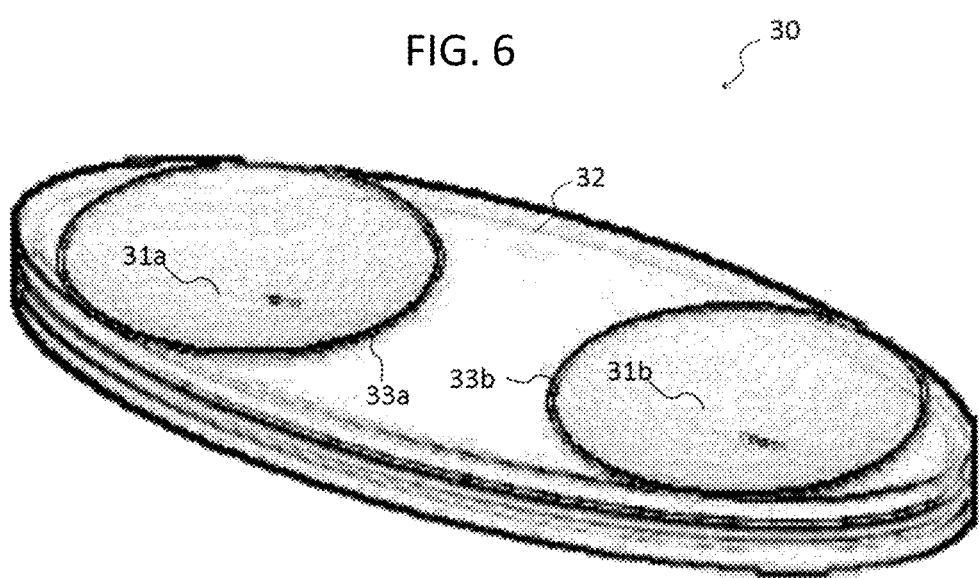
FIG. 6 is a perspective view illustrating a curved shape bodies on which touch panels are provided (third embodiment).

A touch panel according to a third embodiment of the present invention will be described below. FIG. 6 is a perspective view of the third embodiment.

A touch panel 30 is provided on a curved shape bodies. Each of the curved shape bodies is composed of a flat surface and a dome shape. The touch panel 30 includes first input regions 31a, 31b and a second input region 32.

The first input regions 31a, 31b have a concave dome shape. The second input region 32 has a flat surface shape (a zero curvature). The first input regions 31a, 31b are provided side by side within the second input region 32.

Radius of curvatures of the first input regions 31a, 31b are, for example, R40 (radius of curvature of 40 mm), and a curvature of the second input region 32 is zero (infinite radius of curvature). In other words, the touch panel has two different curvatures. Between the first input regions 31a, 31b and the second input region 32, boundary portions 33a, 33b are formed, respectively, at boundaries between the regions.

In the present embodiment, a concave dome shape is referred to but a convex dome shape is also acceptable.

The third embodiment is also a modification of the first embodiment. The third embodiment includes two first input regions such that an input operation can be performed by both hands.

The other structure of the third embodiment is identical to the structure of the first embodiment. A manufacturing method of the third embodiment is also identical to the manufacturing method of the first embodiment.

~Exemplary Application and Effect~

Figure 7:
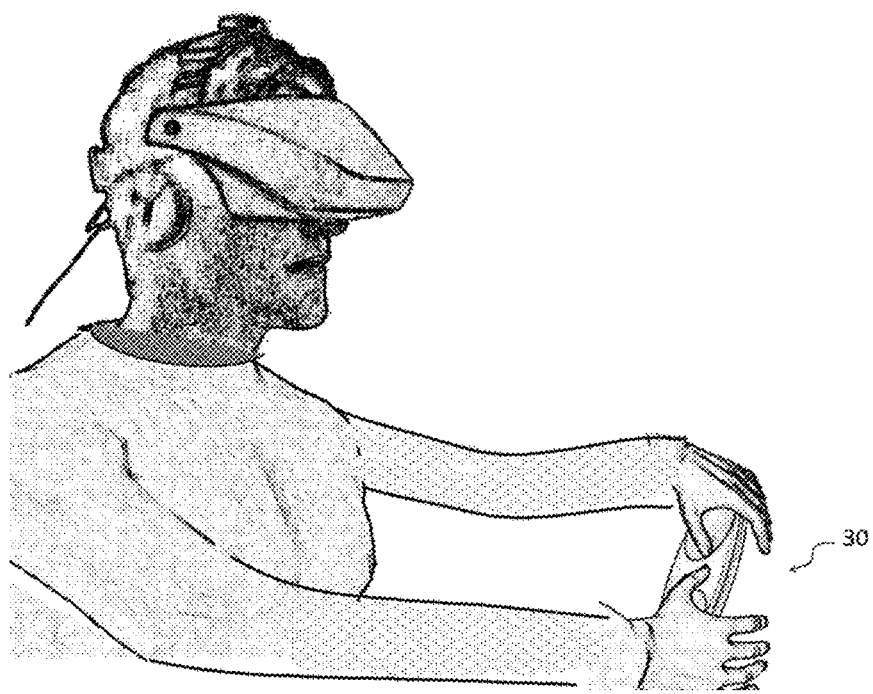
FIG. 7 illustrates an exemplary application to a controller of a head mount display (third embodiment).

FIG. 7 illustrates an exemplary application of the third embodiment. For example, the structure of the third embodiment is applied to a controller of a head mount display.

For example, a dialing operation function is assigned to positions in the adjacent to the boundary portions of the first input regions 31a, 31b, a cursor moving operation function is assigned to centers of the first input regions 31a, 31b, and a button pressing operation function is assigned to the second input region 32.

The third embodiment is also a modification of the first embodiment, and thus can produce almost the equivalent effect.

When an operator wears a head mount display, a controller cannot be viewed. In the touch panel 30, however, an input region can be discriminated with ease by tactile impression. Specifically, the boundary portions 33a, 33b contribute to prevention of misoperation.

Figure 8:
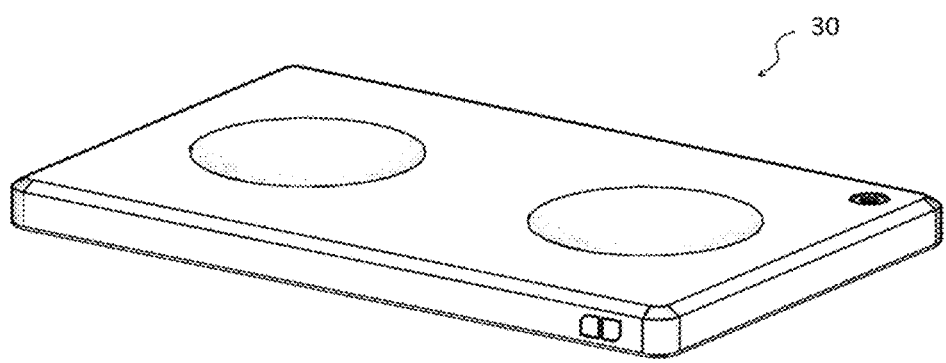
FIG. 8 illustrates an exemplary application to a smartphone or a tablet computer (third embodiment).

FIG. 8 illustrates another exemplary application of the third embodiment. For example, the structure of the third embodiment is applied to a rear surface (another side of a display surface) of a smartphone or a tablet computer.

Presently, in the main stream of fields of smartphones and tablet computers, a touch panel and a display device are combined to be formed into an input/output integrated type device. This structure has such an advantage that intuitive inputting can be performed. To the contrary, this structure has such a disadvantage that oil from a finger makes a display dirty.

In the exemplary application, the touch panel 30 is provided on a rear surface, and an inputting function is assigned to a position corresponding to a display screen of a front surface. Specifically, in a case of performing dial selection from a menu, a dial screen is displayed at a position corresponding to each of the first input regions 31a, 31b. More specifically, an operator performs an inputting operation from a rear surface at the corresponding position while viewing the display screen.

The touch panel 30 has such an advantage that intuitive inputting conforming to the input/output integrated type device can be performed because an input region can be easily discriminated by tactile impression. On the other hand, because the operator does not directly touch the display, the display would not be dirty.

Fourth Embodiment

~Structure~

A touch panel according to a fourth embodiment of the present invention will be described below. A touch panel 40 is provided on a curved shape body. The curved shape body is composed of a convex dome shape. The curved shape body may be composed of a concave dome shape. The dome shape is provided with an input region 41.

More specifically, the fourth embodiment does not include the second input region of the first embodiment. The other structure of the fourth embodiment is identical to the structure of the first embodiment. A manufacturing method of the fourth embodiment is also identical to the manufacturing method of the first embodiment.

~Exemplary Application and Effect~

Figure 9:
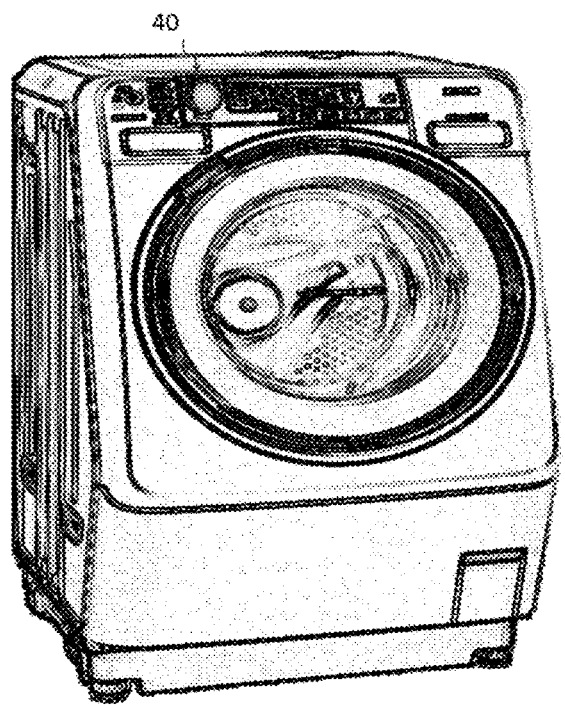
FIG. 9 illustrates an exemplary application to a controller of a home electric appliance (fourth embodiment).

FIG. 9 illustrates an exemplary application of the fourth embodiment. For example, the structure of the fourth embodiment is applied to a controller of a home electric appliance (washing machine in FIG. 9).

The latest home electric appliances are provided with a display panel having a relatively large dimension. A user of a home electric appliance inputs an instruction via a controller while watching the display panel.

For example, a dial selection function is assigned to a dome periphery. A setting key is assigned to a top portion of the dome.

Because the touch panel 40 includes no moving element such as a mechanical switch, a risk of breakage decreases.

In the present exemplary application, a washing machine was referred to but is also applicable to every home electric appliance such as cleaner, microwave oven, refrigerator, rice cooker, air conditioner, etc.

Fifth Embodiment

~Structure~

A touch panel according a fifth embodiment of the present invention will be described below. A touch panel 50 is provided on a curved shape body. The curved shape body is composed of a flat surface and a curved surface. The touch panel 50 includes a first input region 51 and a second input region 52.

The second input region 52 has a flat surface shape (a zero curvature). The first input region 51 is provided at least one edge of the second input region 52. In other words, the first input region 51 is provided on the outside of the second input region 52.

A curvature of the second input region 52 is zero (infinite radius of curvature). The first input region 51 has a gradual curvature (large radius of curvature) so as to be continuous to the second input region 52. A boundary portion 53 is formed at a boundary between the regions. In other words, the touch panel 50 has two different curvatures. Two regions may not be mathematically continuous or may be mathematically continuous (differentiable).

The fifth embodiment is also a modification of the first embodiment and has a structure similar to the structure of the first embodiment. The other structure of the fifth embodiment is identical to the structure of the first embodiment. A manufacturing method of the fifth embodiment is also identical to the manufacturing method of the first embodiment.

~Exemplary Application and Effect~

Figure 10:
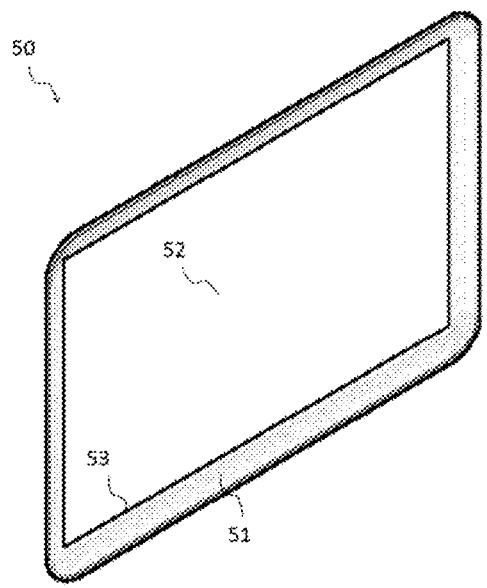
FIG. 10 illustrates an exemplary application to a smartphone or a tablet computer (fifth embodiment).
Figure 11:
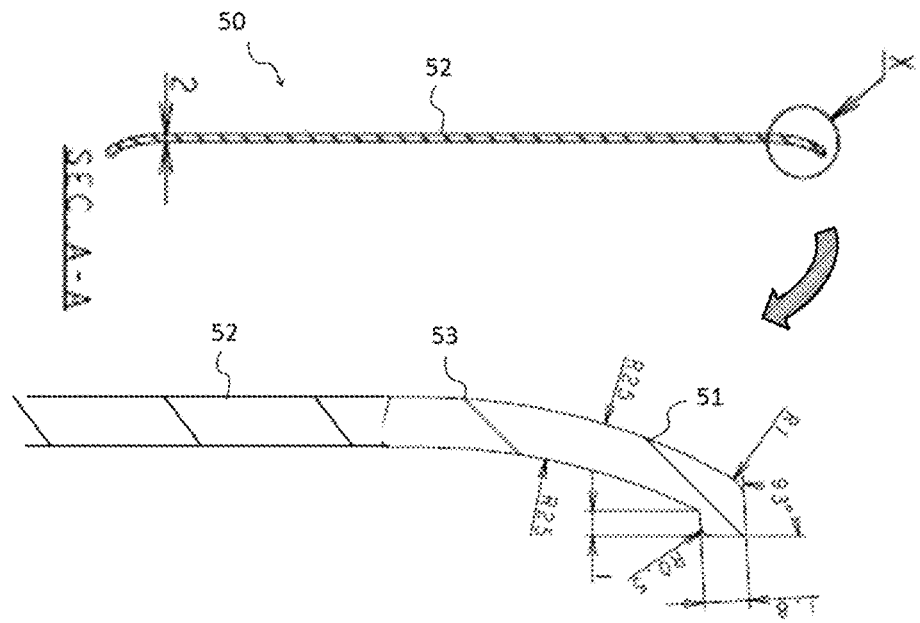
FIG. 11 includes a cross sectional view and an enlarged sectional view of the exemplary application.

FIG. 10 illustrates an exemplary application of the fifth embodiment. For example, the structure of the fifth embodiment is applied to a smartphone or a tablet computer. The fifth embodiment is an input/output integrated type device in which a touch panel and a display device (e.g., liquid crystal display device) are combined. FIG. 11 includes a cross sectional view and an enlarged cross sectional view illustrating an exemplary application of the fifth embodiment.

The second input region 52 corresponds to a display region of a display device. That is, the second input region 52 is transparent. The first input region 51 is provided on the outside (window frame portion) of the display region. Generally, the display region has a square shape, so that a window frame thereof has four sides. At least one side is provided with the first input region 51. The first input region 51 may be provided on two or more sides.

A general smartphone or tablet computer is provided with a mechanical volume button on its side surface portion. When a user wishes to change volume of sound while browsing a moving image, the user instantly averts his eyes, visually recognizes a sound volume button, and operates the sound volume button. Concentration is spoiled for some people. If the user does not visually recognize the button, he may misoperate.

To the contrary, a volume adjustment function is assigned to the second input region 52 of the touch panel 50. The volume adjustment function is performed by a slide-moving operation.

Because the second input region 52 is neighboring the boundary portion 53, the second input region 52 is easily discriminated from the first input region 51 by tactile impression.

Further, if the user is browsing a moving image, the second input region 52 is caught into his visual field without necessity of averting his eyes.

The viewer can adjust the volume without averting his eyes while browsing a moving image owing to the positioning of the second input region and discrimination by tactile impression. Further, misoperation can be prevented.

Still further, because the touch panel 50 includes no moving element such as a mechanical operation button, a risk of breakage decreases.

Figure 12:
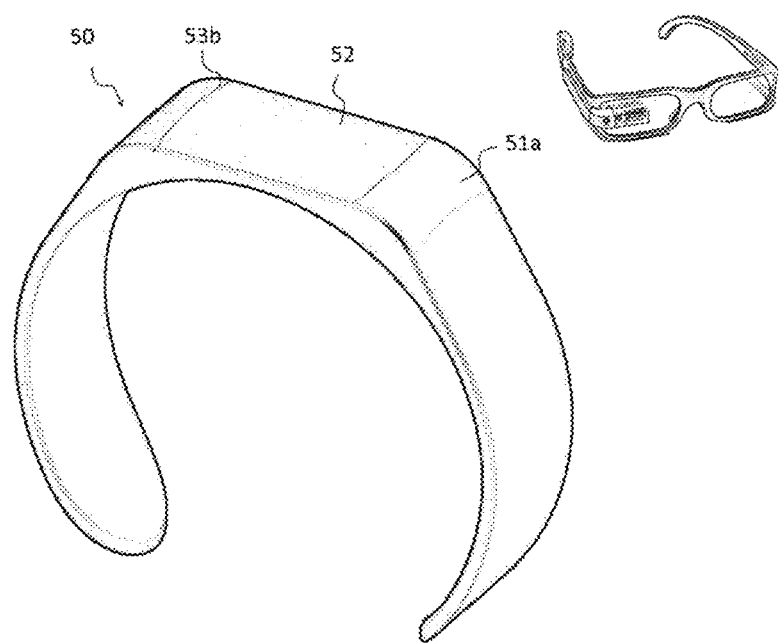
FIG. 12 illustrates an exemplary application to a controller of an eyeglass type display device (fifth embodiment).

FIG. 12 illustrates another exemplary application of the fifth embodiment. For example, the structure of the fifth embodiment is applied to a controller of an eyeglass type display device (optical transmittance).

The touch panel 50 is provided on a curved surface shape of a wristband shape. The touch panel 50 includes first input regions 51a, 51b and a second input region 52.

The second input region 52 is provided at a center of the wristband in a longitudinal direction of a flat surface thereof. The first input regions 51a, 51b are provided both edges of the second input region 52, respectively, in the longitudinal direction of the second input region 52.

A display device is not essential to be placed at a position corresponding to the second input region 52. In some cases, the positioning of the display device thereat may be preferred.

The eyeglass type display device is referred to, i.e., so called as a wearable device, and is often used at a place where a person goes. Therefore, a controller is also desired to be a wearable device.

A menu selection function performed by a slide-moving operation is assigned to the second input region 52 in its longitudinal direction, and a selection setting key performed by double tapping is assigned to each of the first input regions 51a, 51b.

An operator smoothly moves viewing surfaces from one to another on a display by sliding his finger on and over the second input region 52. When the operator finds out a desired viewing surface, the operator makes double tapping on either one of the first input regions 51a, 51b where his finger goes, thereby selecting the display screen.

At the time, because the touch panel 50 includes the boundary portions 53, the first input regions 51 are easily discriminated from the second input region 52 by tactile impression. This can prevent misoperation.

Further, because the controller is also a wristband type wearable device, the operator's behavior would not be unnatural. For example, the operator can operate the device while walking.

Sixth Embodiment

~Structure~

Figure 13:
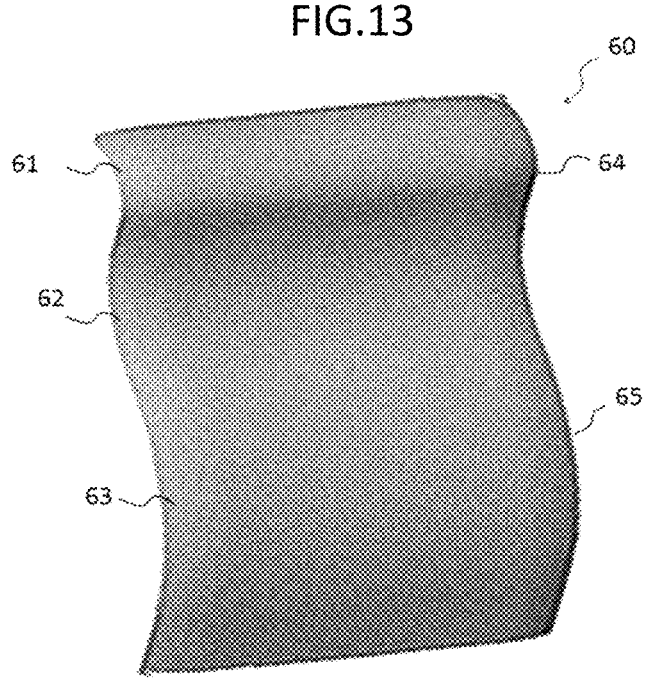
FIG. 13 is a perspective view illustrating a curved shape body on which a touch panel is provided (sixth embodiment).
Figure 14:
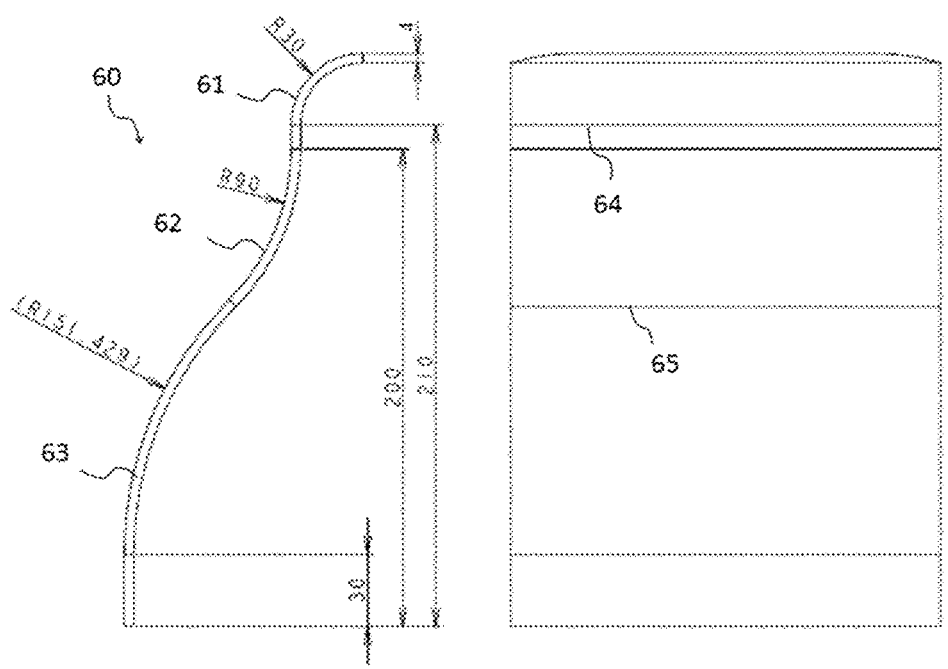
FIG. 14 includes a cross sectional view and a front view of a curved shape body.

A touch panel according to a sixth embodiment of the present invention will be described below. FIG. 13 is a perspective view of the sixth embodiment. FIG. 14 includes a cross sectional view and a front view of the same.

A touch panel 60 is provided on a curved shape body. The curved shape body is composed of a plurality of curved surfaces. For example, the touch panel 60 includes a first input region 61, a second input region 62, and a third input region 63.

A radius of curvature of the first input region 61 is, for example, R30 (radius of curvature of 30 mm). A radius of curvature of the second input region 62 is, for example, R90 (radius of curvature of 90 mm). A radius of curvature of the third input region 63 is, for example, R150 (radius of curvature of 150 mm).

The first input region 61 is continuous to the second input region 62, and a boundary portion 64 is formed at a boundary between the regions. The second input region 62 is continuous to the third input region 63, and a boundary portion 65 is formed at a boundary between the regions. Incidentally, two regions are mathematically continuous in FIG. 13 but may not be mathematically continuous (not differentiable).

In the first input region 61 and the second input region 62, positive and negative of the curvature are reversed. Further, in the second input region 62 and the third input region 63, positive and negative of the curvature are reversed. This contributes to clear definition of each input region.

The sixth embodiment is also a modification of the first embodiment. The curved shape body is composed of a flat surface and a dome shape in the first embodiment, whereas the curved shape body is composed of a plurality of curved surfaces in the sixed embodiment. More specifically, the body of the sixth embodiment includes no flat surface.

The other structure of the sixth embodiment is identical to the structure of the first embodiment. A manufacturing method of the sixth embodiment is also identical to the manufacturing method of the first embodiment.

~Exemplary Application and Effect~

Figure 15:
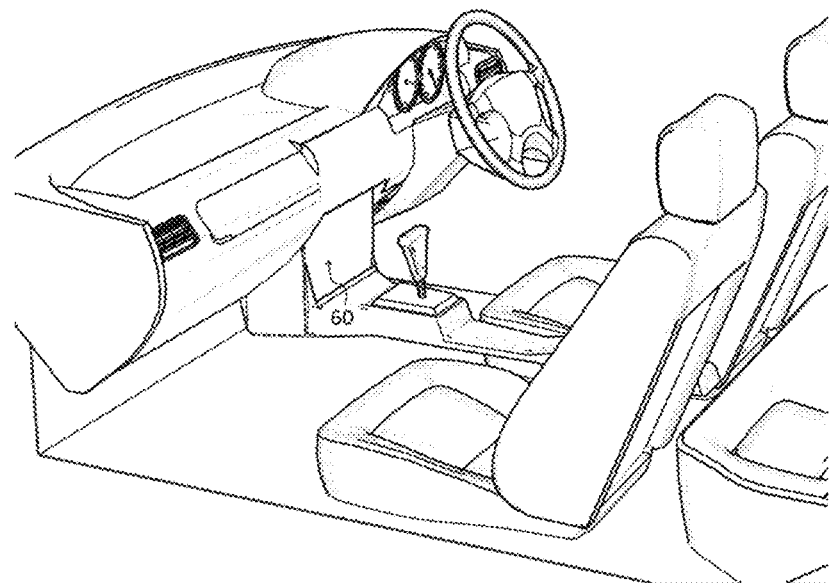
FIG. 15 illustrates an exemplary application to a center console (sixth embodiment).

FIG. 15 illustrates an exemplary application of the sixth embodiment. The structure of the sixth embodiment is applied to a center console installed in a vehicle.

Generally, a center console installed in a vehicle is provided with a car navigation system, an audio device, and an operation panel for room temperature adjustment. Because a plurality of functions is packed within a narrow area, the center console tends to be jumbled and has a limit in design.

In the present exemplary application, an input/output integrated type device in which the touch panel 60 and a display device are combined is applied as a center console. An organic EL display device is employed as the display device. The organic EL display device has such a characteristic that it can be formed into a curved surface shape and thus can be applied as the display device of the touch panel 60.

As an example, an operation panel for room temperature adjustment is displayed at a position corresponding to the position of the first input region 61, an audio system is displayed at a position corresponding to the position of the second input region 62, and a car navigation system (map) is displayed at a position corresponding to the position of the third input region 63. An operation panel is assigned to a position corresponding to the position of each input region.

Because the operation panel is displayed on the organic EL display device, a display of the operation panel for the use can be enlarged. This improves operability.

When a display of the organic EL display device is turned off, only a plain front surface is left in the center console. This can provide a simple design.

The touch panel 60 can be formed into any shape, that is to say, there is no limit in design of the touch panel 60. When designing the interior of a vehicle, a designer is free from considering where to place the operation panel.

Further, because the touch panel 60 includes no moving element such as a mechanical operation panel, a risk of breakage decreases.

Figure 16:
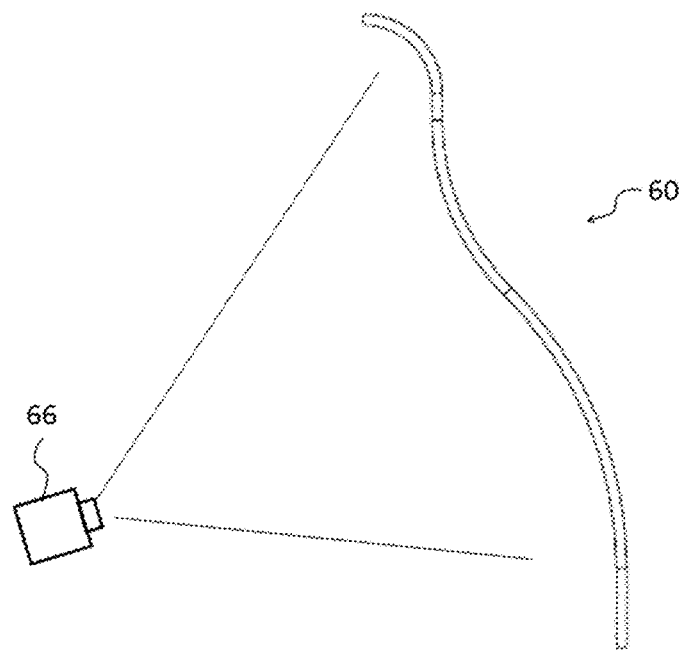
FIG. 16 illustrates a combination with a rear-projection (sixth embodiment).

FIG. 16 illustrates a modification of the present exemplary application.

In the above described exemplary application, an organic EL display device is employed as the display device. A rear-projection device may also be employed. The touch panel 60 and a rear-projection film 66 are combined.

When an image such as an operation panel, etc. is projected from the back by using a compact projector 67, an operation panel, etc. is displayed on the center console.

Figure 17:
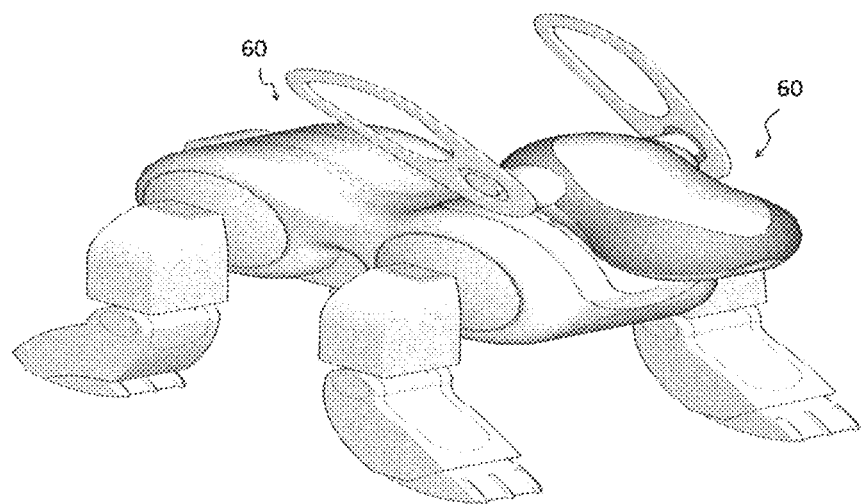
FIG. 17 illustrates an exemplary application to a pet robot (sixth embodiment).

FIG. 17 illustrates another exemplary application of the sixth embodiment. The structure of the sixth embodiment is applied to a pet robot.

Recently, a pet robot is drawing attention as a brand new interface. Even an old person having psychological resistance against a digital device often does not feel resistance to a pet robot.

On the other hand, because the touch panel 60 can be formed into any shape, it can be applied to the head or the back of the pet robot.

When a person strokes the head or the back of the pet robot, a manner of stroking may sometimes differ according to his health condition. The touch panel 60 detects a difference of the manner of stroking. The pet robot transfers the detection data to a medical institution. The medical institution analyzes the detection data to estimate the health condition of the old person.

The pet robot may be formed into an input/output integrated type device that is made of a combination of the touch panel 60 and a display device.

Further, an output of voice indication from the pet robot causes the touch panel 60 to serve as an input interface. For example, two alternatives are prepared as answers to a questionnaire that is output as a speech, and a person inputs his answer by tapping the head or the back.

Seventh Embodiment

~Structure~

Figure 18:
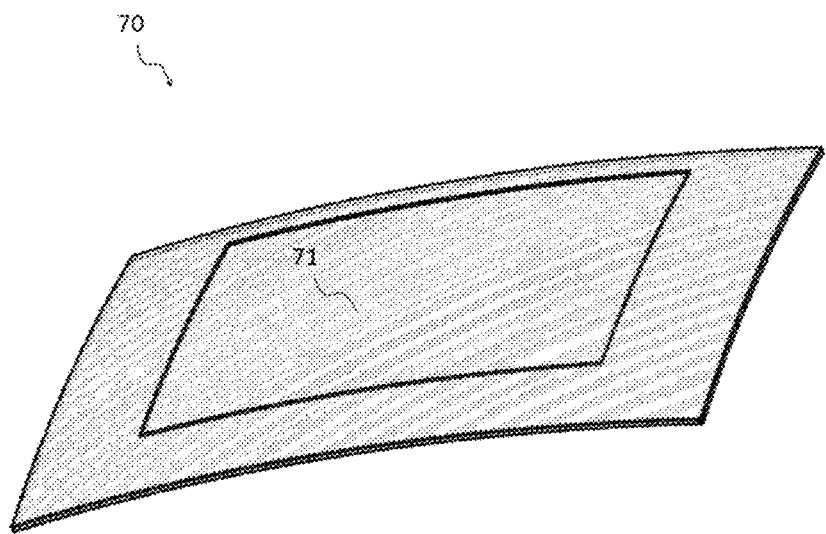
FIG. 18 is a perspective view of a curved shape body on which a touch panel is provided (seventh embodiment).
Figure 19:
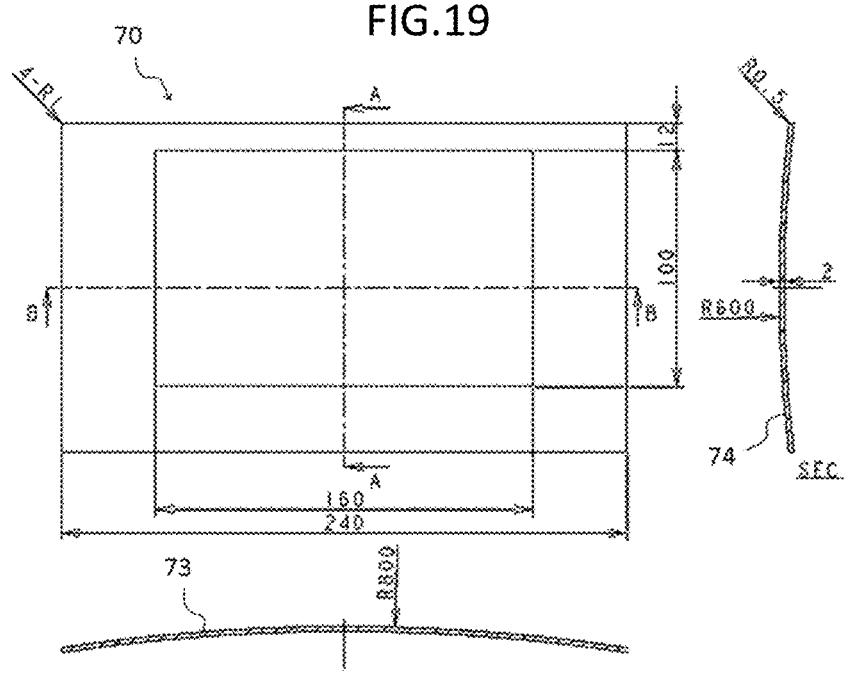
FIG. 19 includes a cross sectional view and a front view illustrating a curved shape body.

A touch panel according to a seventh embodiment of the present invention will be described below. FIG. 18 is a perspective view illustrating the seventh embodiment. FIG. 19 includes a cross sectional view and a front view of the same.

The touch panel 70 is provided on a curved shape body. The curved shape body is composed of a convex curved surface. The convex curved surface is provided with an input region 71. The input region 71 has two different curvatures in the same curved surface, i.e., a curvature 73 in an X direction and a curvature 74 in a Y direction in a single curved surface.

For example, in FIG. 19, the radius of curvature 73 in the X direction is R800 (radius of curvature of 800 mm), and the radius of curvature 74 in the Y direction is R600 (radius of curvature of 600 mm). In other words, the input region 71 has two different curvatures.

In the present embodiment, the convex curved surface is referred to but a concave curved surface is also acceptable.

~Exemplary Application and Effect~

For example, the structure of the seventh embodiment is applied to an input/output integrated type device in which the touch panel 70 and a stereoscopic image display device are combined.

Because a viewing surface has a convex curved surface, solidity of the stereoscopic image is more emphasized.

The display device may be an organic EL display device or may be a rear-projection device.

The touch panel 70 can be formed into any shape, so that it can be applied to a display device having a convex curved surface.

Figure 20:
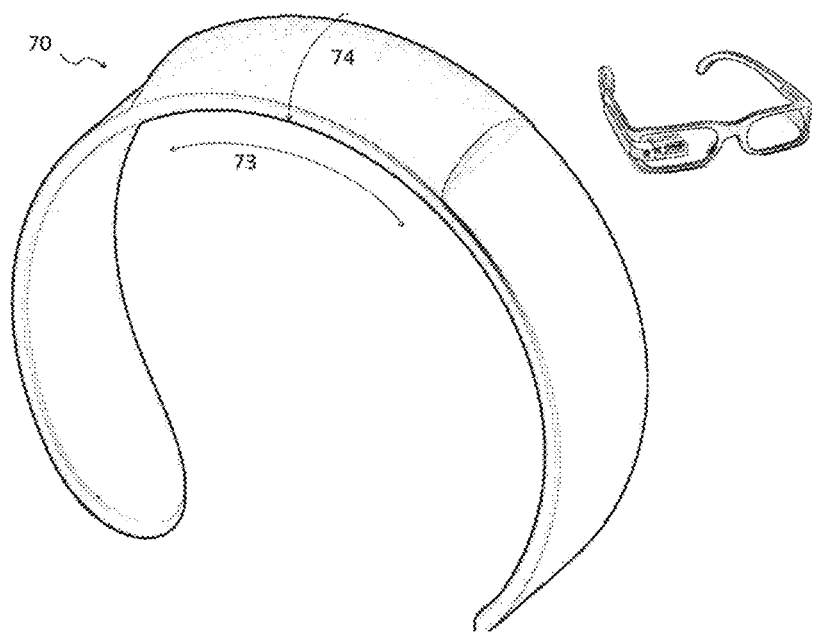
FIG. 20 illustrates an exemplary application to a controller of an eyeglass type display device (seventh embodiment).

FIG. 20 illustrates another exemplary application of the seventh embodiment. For example, the structure of the seventh embodiment is applied to a controller of an eyeglass type display device (optical transmittance). More specifically, the seventh embodiment is used in the same manner as illustrated in FIG. 12 (fifth embodiment).

The touch panel 70 is provided on a curved shape body. The curved shape body is composed of a convex curved surface of a wristband shape. The convex curved surface is provided with an input region 71. The input region 71 has two different curvatures in the same curved surface, i.e., a curvature 73 in an X direction and a curvature 74 in a Y direction in a single curved surface.

A display device is not essential to be placed at a position corresponding to the input region 71. In some cases, the positioning of the display device may be preferred.

The eyeglass type display device is referred to, i.e., so called as a wearable device and is often used at a place where a person goes. Therefore, a controller is also desired to be a wearable device.

For example, a menu selection function performed by a slide-moving operation is assigned to the input region 71 in its longitudinal direction, and a selection setting key executed by double tapping is assigned to a display screen reached by sliding.

An operator smoothly moves viewing surfaces from one to another on and over a display by sliding a finger on the input region 71. When the operator finds out a desired viewing surface, the operator makes double tapping to select the display screen.

At the time, a difference between the curvature 73 in the X direction and the curvature 74 in the Y direction contributes to formation of a top portion of the curved surface. A position of the top portion is easily discriminated by tactile impression. More specifically, the operator can almost recognize where he is touching on the touch panel on the basis of a distance from the top. This can reduce misoperation.

Further, because the controller is also a wristband type wearable device, the operator's behavior would not be unnatural. For example, the operator can operate the device while walking.

<Others>

Hereinbefore, the embodiments and the exemplary applications of the present invention were described, the present invention, however, is not limited thereto. Any changes and modifications of the present invention such as combination of the above described embodiments should be construed as being included in the scope of the technical idea of the present invention.

Incidentally, the general touch panel is composed of a flat sheet film provided with a plurality of electrodes arranged thereon.

The inventor of the present application noticed that, even if the flat sheet is extended, disconnection would not occur when a ductile wire material is used for the electrodes and inter-electrode wire and means of a thermoforming method is employed. Further, the inventor noticed that a risk of disconnection can be more reduced if a net-shaped conductor is employed for the electrodes and the inter-electrode wire.

The inventor conceived of such an idea that a flat sheet might be formed into any shape by extending the flat sheet and actually made a sample of a touch panel having a curved surface.

The inventor made various samples of a touch panel having a curved surface. As a result, all the touch panels were free from disconnection and had a position detection function of the touch panel. For example, the touch panel could be formed into a curved surface having a relatively large curvature, i.e., a curved surface having a radius of curvature of 40 mm, without any problem.

Further, the inventor of the present application studied about an applicable range of the various touch panels having a curved surface (see, first to seventh embodiments). It was figured out that application of the invention of the present application can produce a remarkable effect that cannot be produced by the conventional technology.

The invention of the present application was made as a result of the above described trials and errors.

REFERENCE CHARACTER LIST 1 flat sheet
2 island-like electrode (array)
3 island-like electrode (array)
4 inter-electrode wire
10 touch panel
11 first input region
12 second input region
13 boundary portion
14 touch panel
21 first input region
22 second input region
23 boundary portion
24 third input region
25 boundary portion
30 touch panel
31 first input region
32 second input region
33 boundary portion
40 touch panel
41 input region
50 touch panel
51 first input region
52 second input region
53 boundary portion
60 touch panel
61 first input region
62 second input region
63 third input region
64 boundary portion
65 boundary portion
66 rear-projection film
67 projector
70 touch panel
71 input region
73 radius of curvature in an X direction
74 radius of curvature in a Y direction

The invention claimed is:

1. A touch panel comprising:
a curved shape body formed by thermoforming a flat sheet;
an input region provided on the curved shape body;
a plurality of electrodes, formed of a ductile wire material, arrayed in each of an X direction and a Y direction on the input region so as to form a lattice shape; and,
lead wirings connected to ends of electrode arrays of the electrodes;
wherein the electrodes and the lead wirings are formed of a ductile wire material that is composed of at least one metal selected from Au, Ag, Cu, and Al by means of a method of etching a thin film or a metal vapor deposition method using a vapor deposition mask or a ductile wire material that is composed of an Ag compound by means of a conductive silver forming method using silver salt, wherein a plurality of island-shaped electrodes are provided along an x direction on one surface side of the thin film, and a plurality of island-shaped electrodes are provided along a y direction on a second surface side of the thin film;
wherein the electrodes and the lead wirings are both formed into a mesh-patterned conductor and arranged in a single layer within the flat sheet so as to be formed into a mesh-patterned conductor having an aperture ratio equal to or more than 90%, wherein through holes are formed in the flat sheet and the flat sheet is thermoformed into the curved shaped body of the touch panel;
wherein the input region comprises a first input region and a second input region having a curvature different from a curvature of the first input region; and
wherein the first input region is continuous to the second input region, and a boundary portion is formed between the regions for discriminating the regions by tactile impression without necessity of visual confirmation.

2. A touch panel according to claim 1, wherein positive and negative of the curvature are reversed in the first input region and the second input region.

3. A touch panel according to claim 1, wherein the curvature of the second input region is zero.

4. A touch panel according to claim 3, wherein the first input region is provided on a dome shaped portion on the inside of the second input region.

5. A touch panel according to claim 3, wherein the first input region is provided on the outside of the second input region.

6. An input/output integrated type display device comprising:
an organic EL display device; and
the touch panel according to claim 1, wherein the curved shape body is composed of a transparent resin film and arranged on the organic EL display device.

7. An input/output integrated type display device comprising:
a projector; and
the touch panel according to claim 1, wherein the curved shape body is used as a projection surface of the projector.

8. A method of manufacturing the touch panel according to claim 1, comprising:
arranging the electrodes within a flat sheet; and
forming the flat sheet into the curved shape body by thermoforming.

9. A touch panel comprising:
a curved shape body formed by thermoforming a flat sheet;
an input region provided on the curved shape body;
a plurality of electrodes, formed of a ductile wire material, arrayed in each of an X direction and a Y direction on the input region so as to form a lattice shape; and,
lead wirings connected to ends of electrode arrays of the electrodes;
wherein the electrodes and the lead wirings are formed of a ductile wire material that is composed of at least one metal selected from Au, Ag, Cu, and Al by means of a method of etching a thin film or a metal vapor deposition method using a vapor deposition mask or a ductile wire material that is composed of an Ag compound by means of a conductive silver forming method using silver salt, wherein a plurality of island-shaped electrodes are provided along an x direction on one surface side of the thin film, and a plurality of island-shaped electrodes are provided along a y direction on a second surface side of the thin film;
wherein the electrodes and the lead wirings are both formed into a mesh-patterned conductor and arranged in a single layer within the flat sheet so as to be formed into a mesh-patterned conductor having an aperture ratio equal to or more than 90%, wherein through holes are formed in the flat sheet and the flat sheet is thermoformed into the curved shaped body of the touch panel; and
wherein the curvature in the X direction of the input region differs from the curvature in the Y direction of the input region, and a top portion is formed for discriminating the regions by tactile impression without necessity of visual confirmation.

10. An input/output integrated type display device comprising:
an organic EL display device; and
the touch panel according to claim 9, wherein the curved shape body is composed of a transparent resin film and arranged on the organic EL display device.

11. An input/output integrated type display device comprising:
a projector; and
the touch panel according to claim 9, wherein the curved shape body is used as a projection surface of the projector.

12. A method of manufacturing the touch panel according to claim 9, comprising:
arranging the electrodes within a flat sheet; and
forming the flat sheet into the curved shape body by thermoforming.

* * * * *